US012777296B2

(12) United States Patent
Hlífarsdóttir et al.

(10) Patent No.: US 12,777,296 B2
(45) Date of Patent: Oct. 27, 2026

(54) HEARING DEVICE, ELECTRONIC CIRCUIT, ELECTRONIC CIRCUIT BOARD, AND RELATED METHODS OF MANUFACTURING

(71) Applicant: GN Hearing A/S, Ballerup (DK)

(72) Inventors: Ragna Fanney Hlífarsdóttir, Ballerup (DK); Finn Hansen, Smørum (DK); Nils Knudsen, Ballerup (DK)

(73) Assignee: GN HEARING A/S, Ballerup (DK)

( * ) Notice: Subject to any disclaimer, the term of this patent is extended or adjusted under 35 U.S.C. 154(b) by 131 days.

(21) Appl. No.: 18/679,239

(22) Filed: May 30, 2024

(65) Prior Publication Data

US 2025/0016511 A1 Jan. 9, 2025

(30) Foreign Application Priority Data

Jul. 4, 2023 (EP) .................................... 23183302

(51) Int. Cl.
*H04R 25/00* (2006.01)
*H04R 31/00* (2006.01)
*H05K 1/02* (2006.01)

(52) U.S. Cl.
CPC ......... *H04R 25/609* (2019.05); *H04R 25/602* (2013.01); *H04R 25/604* (2013.01); (Continued)

(58) Field of Classification Search
CPC .............. H04R 25/356; H04R 2460/03; H04R 25/502; H04R 25/505; H04R 25/609; H04R 25/602; H04R 25/604; H04R 31/00; H05K 1/0277; H05K 1/0216; H05K 2201/10037; H05K 2201/10522
See application file for complete search history.

(56) References Cited

U.S. PATENT DOCUMENTS 5,710,820 A * 1/1998 Martin ................. H04R 25/356 381/321
6,674,869 B2 * 1/2004 Paczkowski ......... H04R 25/609 381/328
(Continued)

FOREIGN PATENT DOCUMENTS

DE 102008022977 4/2009

OTHER PUBLICATIONS

Extended European Search Report for EP Patent Appln. No. 23183302.1 dated Dec. 1, 2023.

*Primary Examiner* — Carolyn R Edwards
*Assistant Examiner* — Julie X Dang
(74) *Attorney, Agent, or Firm* — Vista IP Law Group, LLP

(57) ABSTRACT

Hearing device, electronic circuit, electronic circuit board, and related methods, in particular a method of manufacturing an electronic circuit for an hearing device is disclosed, the hearing device comprises an electronic circuit board comprising a first section and a second section; one or more first electronic components configured to operate at a first voltage, the one or more first electronic components being mounted on or in the first section; and one or more second electronic components configured to operate at a second voltage, the one or more second electronic components being mounted on or in the second section; wherein the second voltage is lower than the first voltage and wherein the first section is separate from the second section.

28 Claims, 4 Drawing Sheets

(52) U.S. Cl.
CPC ........... *H04R 31/00* (2013.01); *H05K 1/0277* (2013.01); *H05K 1/0216* (2013.01); *H05K 2201/10037* (2013.01); *H05K 2201/10522* (2013.01)

(56) References Cited

U.S. PATENT DOCUMENTS

| | | | | |
|---|---|---|---|---|
| 8,461,693 | B2 * | 6/2013 | Lim | H05K 1/189<br>438/109 |
| 10,575,106 | B1 * | 2/2020 | Bergmann | H04R 25/505 |
| 10,827,283 | B2 | 11/2020 | Lyon et al. | |
| 2009/0285415 | A1 * | 11/2009 | Wu | H04R 3/00<br>381/113 |
| 2016/0057546 | A1 * | 2/2016 | Lyon | H05K 1/147<br>381/312 |
| 2017/0156011 | A1 * | 6/2017 | Rasmussen | H01Q 1/38 |
| 2017/0263569 | A1 * | 9/2017 | Sommer | H10P 14/412 |
| 2021/0385570 | A1 * | 12/2021 | Zhang | H04R 1/1041 |
| 2022/0209567 | A1 * | 6/2022 | Li | H04R 1/1025 |
| 2022/0377470 | A1 * | 11/2022 | Lindberg | H04R 25/604 |

* cited by examiner

HEARING DEVICE, ELECTRONIC CIRCUIT, ELECTRONIC CIRCUIT BOARD, AND RELATED METHODS OF MANUFACTURING

RELATED APPLICATION DATA

This application claims priority to, and the benefit of, European Patent Application No. 23183302.1 filed on Jul. 4, 2023, pending. The above application is expressly incorporated by reference herein.

FIELD

The present disclosure relates to hearing devices, electronic circuits, electronic circuit boards, and related methods, in particular a method of manufacturing an electronic circuit for a hearing device.

BACKGROUND

Rechargeable devices, such as hearing devices comprising electronic circuits with electronic components may often be exposed to electromagnetic fields creating unwanted noise disturbing the operation of electronic components of the electronic circuit. It is therefore desirable to reduce this noise disturbing the operation of electronic components of the electronic circuit. Today, reduction of noise is achieved by providing additional ground connections on the electronic circuits. These ground connections may however be voluminous and cumbersome to have in a hearing device.

SUMMARY

Today, electronic components of a hearing device, such as electronic components having different voltages, are arranged adjacent to each other. This leads to unwanted electrical noise and a need for additional ground connections.

Accordingly, there is a need for hearing devices and methods of manufacturing hearing devices with improved noise reduction.

A hearing device is disclosed, the hearing device is configured for being worn at an ear of a user. The hearing device comprises an electronic circuit board comprising a first section and a second section; one or more first electronic components configured to operate at a first voltage, the one or more first electronic components being mounted on or in the first section; and one or more second electronic components configured to operate at a second voltage, the one or more second electronic components being mounted on or in the second section; wherein the second voltage is lower than the first voltage and wherein the first section is separate from the second section.

Also disclosed is an electronic circuit for a hearing device. The electronic circuit comprises an electronic circuit board comprising a first section and a second section; one or more first electronic components configured to operate at a first voltage, the one or more first electronic components being mounted on or in the first section; and one or more second electronic components configured to operate at a second voltage, the one or more second electronic components being mounted on or in the second section; wherein the second voltage is lower than the first voltage and wherein the first section is separate from the second section.

Also disclosed is an electronic circuit board for a hearing device. The electronic circuit board comprises a first section comprising a plurality of first electrical connector pads for mounting one or more first electronic components; a second section comprising a plurality of second electrical connector pads for mounting one or more second electronic components; wherein the plurality of first electrical connector pads are configured to be connected to the one or more first electrical components operating at a first voltage and the plurality of second electrical connector pads are configured to be connected to the one or more second electrical components operating at a second voltage, wherein the second voltage is lower than the first voltage and wherein the first section is separate from the second section.

Further, a method of manufacturing an electronic circuit of or for a hearing device is disclosed, the method comprising providing an electronic circuit board; mounting one or more electronic components on or in a first section of the electronic circuit board; mounting one or more second electronic components on or in a second section of the electronic circuit board; wherein the one or more first electronic components are configured to operate at a first voltage and the one or more second electronic components are configured to operate at a second voltage, wherein the second voltage is lower than the first voltage and wherein the first section is separate from the second section, e.g., the one or more first electronic components are separate from the one or more second electronic components.

It is an advantage of the present disclosure that noise, such as electrical noise, in the hearing device is reduced while reducing the number of ground connections. It may be appreciated that an increased noise reduction may be provided while an increased design flexibility of the hearing device is achieved.

A further advantage of the present disclosure is that corrosion of the most exposed areas of the hearing device, electronic circuit, and electronic circuit board is reduced.

Further, an advantage of the present disclosure is that a more compact hearing device is provided.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
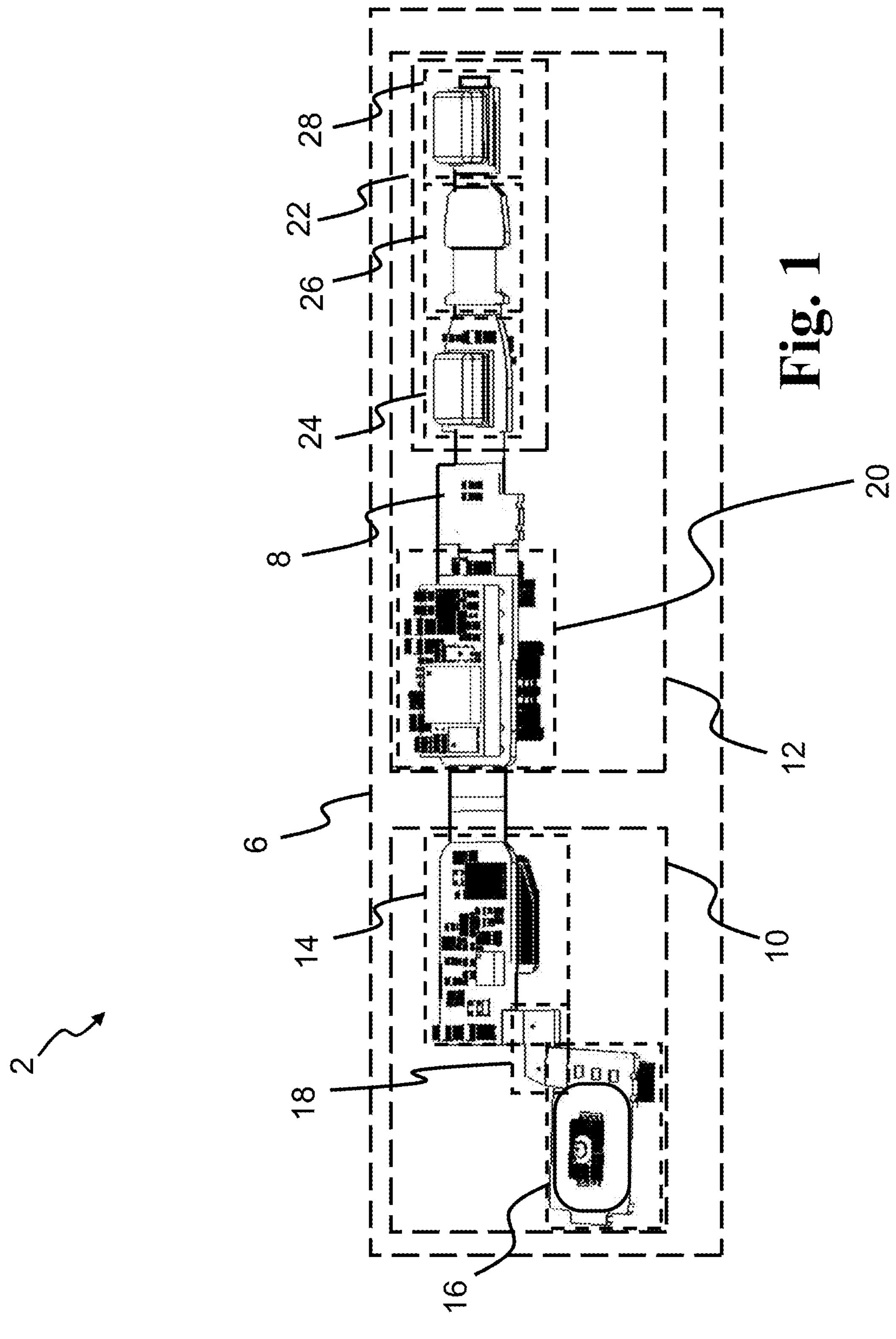
FIG. 1 schematically illustrates an example electronic circuit for a hearing device according to the disclosure, FIG. 2 schematically illustrates an example electronic circuit for a hearing device according to the disclosure, FIG. 3 schematically illustrates an example electronic circuit for a hearing device according to the disclosure, and FIG. 4 schematically illustrates an example electronic circuit for a hearing device according to the disclosure.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

The figures are schematic and simplified for clarity, and they merely show details which aid understanding the disclosure, while other details have been left out. Throughout, the same reference numerals are used for identical or corresponding parts.

A hearing device is disclosed. The hearing device is configured for being worn at an ear of a user. In one or more example hearing devices, the hearing device comprises a memory, one or more interfaces (such as one or more wired interfaces and/or one or more wireless interfaces), one or more processors, one or more microphones, and one or more receivers and/or speakers. The hearing device may be a hearable or a hearing aid, wherein the one or more processors may be configured to compensate for a hearing loss of a user. In one or more example hearing devices, the hearing device may be seen as an audio device, such as a headset.

The hearing device may be of the behind-the-ear (BTE) type, in-the-ear (ITE) type, in-the-canal (ITC) type, receiver-in-canal (RIC) type or receiver-in-the-ear (RITE) type. The hearing aid may be a binaural hearing aid. The hearing device may comprise a first earpiece and a second earpiece, wherein the first earpiece and/or the second earpiece is an earpiece as disclosed herein.

The hearing device may be configured for wireless communication with one or more devices, such as with another hearing device, e.g. as part of a binaural hearing system, and/or with one or more accessory devices, such as a smartphone and/or a smart watch. The hearing device optionally comprises an antenna for converting one or more wireless input signals, e.g. a first wireless input signal and/or a second wireless input signal, to antenna output signal(s). The wireless input signal(s) may origin from external source(s), such as spouse microphone device(s), wireless TV audio transmitter, and/or a distributed microphone array associated with a wireless transmitter. The wireless input signal(s) may origin from another hearing device, e.g. as part of a binaural hearing system, and/or from one or more accessory devices.

The hearing device optionally comprises a radio transceiver coupled to the antenna for converting the antenna output signal to a transceiver input signal. Wireless signals from different external sources may be multiplexed in the radio transceiver to a transceiver input signal or provided as separate transceiver input signals on separate transceiver output terminals of the radio transceiver. The hearing device may comprise a plurality of antennas and/or an antenna may be configured to be operate in one or a plurality of antenna modes. The transceiver input signal optionally comprises a first transceiver input signal representative of the first wireless signal from a first external source.

In one or more example hearing devices, the hearing device comprises a set of microphones. The set of microphones may comprise one or more microphones. The set of microphones comprises a first microphone for provision of a first microphone input signal and/or a second microphone for provision of a second microphone input signal. The set of microphones may comprise N microphones for provision of N microphone signals, wherein N is an integer in the range from 1 to 10. In one or more exemplary hearing devices, the number N of microphones is two, three, four, five or more. The set of microphones may comprise a third microphone for provision of a third microphone input signal.

The hearing device optionally comprises a pre-processing unit. The pre-processing unit may be connected to the radio transceiver for pre-processing the transceiver input signal. The pre-processing unit may be connected the first microphone for pre-processing the first microphone input signal. The pre-processing unit may be connected the second microphone if present for pre-processing the second microphone input signal. The pre-processing unit may comprise one or more A/D-converters for converting analog microphone input signal(s) to digital pre-processed microphone input signal(s).

In one or more hearing devices, the hearing device comprises a processor for processing input signals, such as pre-processed transceiver input signal and/or pre-processed microphone input signal(s). The processor provides an electrical output signal based on the input signals to the processor. Input terminal(s) of the processor are optionally connected to respective output terminals of the pre-processing unit. For example, a transceiver input terminal of the processor may be connected to a transceiver output terminal of the pre-processing unit. One or more microphone input terminals of the processor may be connected to respective one or more microphone output terminals of the pre-processing unit.

In one or more example hearing devices, the hearing device comprises a processor for processing input signals, such as pre-processed transceiver input signal(s) and/or pre-processed microphone input signal(s). The processor is optionally configured to compensate for hearing loss of a user of the hearing device. The processor provides an electrical output signal based on the input signals to the processor. Input terminal(s) of the processor are optionally connected to respective output terminals of the pre-processing unit. For example, a transceiver input terminal of the processor may be connected to a transceiver output terminal of the pre-processing unit. One or more microphone input terminals of the processor may be connected to respective one or more microphone output terminals of the pre-processing unit.

The hearing device comprises an electronic circuit board comprising a first section and a second section. An electronic circuit board as disclosed herein may be seen as a board configured to have one or more electronic components mounted in or on the board. For example, an electronic circuit board may be seen as a printed circuit board, PCB, such as a flexible PCB. In other words, the electronic circuit board may e.g. be configured to mechanically support and electrically connect one or more electronic components or electrical components using e.g. conductive tracks or pads. The electronic circuit board may comprise one or more sheet layers of a conductive layer, laminate, or film such as of copper e.g. laminated onto and/or between sheet layers of a non-conductive substrate. The electronic circuit as disclosed herein may be designated as a system in package electronic circuit comprising the electronic circuit board as disclosed herein and the one or more electronic components as disclosed herein. In one or more example hearing devices, the hearing device comprises a housing configured to house the electronic circuit as disclosed herein.

A section as disclosed herein may be seen as a defined portion of an electronic circuit board, such as a delimitated area of the electronic circuit board. For example, the first section may be seen as a defined first portion of the electronic circuit board, such as a first delimitated area of the electronic circuit board. The first section may be seen as a first subdivision of the electronic circuit board. The second section may be seen as a defined second portion of the electronic circuit board, such as a second delimitated area of the electronic circuit board. The second section may be seen as a second subdivision of the electronic circuit board.

The hearing device, such as the electronic circuit board and/or electronic circuit, may comprise one or more ground connections. A ground connection may e.g. be a ground connection of the electronic circuit board, such as a ground connection through which the one or more electronic components may be connected to a ground connection of the circuit board, a ground pad ring e.g. at least partly encircling an electronic component. A ground connection may comprise one or more ground pad elements.

In one or more example hearing devices, the power wiring of the electronic circuit board is arranged in one single layer. An advantage of separating the first section and the second section, such as separating the one or more first electrical components and the one or more second electrical components, is that the power wiring of the electronic circuit board may be arranged in one single layer of the electronic circuit board. In currently known hearing devices, electronic components having different voltages are arranged adjacent to each other. This requires having the power wiring of the different voltage components in different layers of the electronic circuit board. Thereby, more layers of the electronic circuit board are occupied by power wiring, which leads to electronic circuit boards comprising more layers and thicker electronic circuit boards which are less flexible.

An advantage of the present disclosure is therefore that fewer layers are required in the electronic circuit board and in turn thinner and more flexible electronic circuit boards may be provided.

In one or more example hearing devices, the electronic circuit board is a 4-layer or 5-layer circuit board. In other words, the electronic circuit board may have less than 6-layers but at least 4 layers, such as 5 layers or 4 layers. An advantage of having an electronic circuit board being a 4-layer or 5-layer circuit board is that the electronic circuit board is more flexible than electronic circuit boards having more than 5 layers. In turn, an electronic circuit board being a 4-layer, or 5-layer circuit board can be bent with a larger angle than electronic circuit boards having more than 5 layers.

The hearing device comprises one or more first electronic components configured to operate at a first voltage. In other words, the one or more first electrical components may be configured to use or function with a specific first electrical potential difference or first voltage level. Voltage, typically measured in volts (V), is a measure of the electric potential energy per unit charge in a circuit. Operating at a first voltage may be understood as the one or more first electrical components, the first section of the electronic circuit board, and/or the first region of the electronic circuit is configured to work within a particular voltage range or specified voltage level, such as configured to operate at a first voltage range, e.g., one or more first voltages. This voltage level can vary depending on the application, system requirements, or the specific component's design limitations.

The one or more first electronic components are mounted on or in the first section. For example, the one or more first electronic components may be seen as physically installed and/or embedded within a particular area or subdivision of the electronic circuit board, e.g., being the first section. Mounting the one or more first electronic components may involve securely attaching or affixing them to the designated first section, typically through soldering, adhesive bonding, and/or mechanical fastening techniques. This may ensure that the components are physically connected to the electronic circuit board and are held in place to withstand environmental conditions, vibration, and other operational factors.

The hearing device comprises one or more second electronic components configured to operate at a second voltage. In other words, the one or more second electrical components may be configured to use or function with a specific second electrical potential difference or second voltage level. Operating at a second voltage may be understood as the one or more second electrical components, the second section of the electronic circuit board, and/or the second region of the electronic circuit is configured to work within a particular voltage range or specified voltage level, such as configured to operate at a second voltage range, e.g., one or more second voltages. This voltage level can vary depending on the application, system requirements, or the specific component's design limitations.

The one or more second electronic components are mounted on or in the second section. For example, the one or more second electronic components may be seen as physically installed and/or embedded within a particular area or subdivision of the electronic circuit board, e.g., being the second section. Mounting the one or more second electronic components may involve securely attaching or affixing them to the designated second section, typically through soldering, adhesive bonding, and/or mechanical fastening techniques. This may ensure that the components are physically connected to the electronic circuit board and are held in place to withstand environmental conditions, vibration, and other operational factors.

The second voltage is lower than the first voltage. The second voltage being lower than the first voltage may be seen as a second voltage range being lower than a first voltage range. In one or more example hearing devices, the one or more second electrical components are configured to operate at a second voltage, such as operate in a second voltage range, being lower than a first voltage, such as first voltage range, that the one or more first electrical components are configured to operate at. It may be appreciated that different sections of the electronic circuit board may have different characteristics and functions. For example, the first section may have a first function and the second section may have a second function.

By separating the first section and the second section, it is an advantage of the present disclosure that noise, such as electrical noise, in the hearing device is reduced while reducing the number of ground connections. It may be appreciated that an increased noise reduction may be provided while an increased design flexibility of the hearing device is achieved.

In one or more example hearing devices, example hearing devices, the second voltage is in the range of 0.5 V to 2.0 V. In other words, the one or more second electrical components may be configured to operate at a second voltage in the range of 0.5 V to 2.0 V.

In one or more example hearing devices, the first voltage may be lower than the second voltage.

In one or more example hearing devices, the first voltage is in the range of 3.5 V to 4.5 V.

In other words, the one or more first electrical components may be configured to operate at a first voltage in the range of 3.5 V to 4.5 V. The first voltage may for example be 4 V.

The first section is separate from the second section. In other words, the electronic circuit board of the hearing device is divided in a first section and a second section which are separate from each other. For example, by separating the first section from the second section it allows to organize and compartmentalize the electronic components of the hearing device, such as to organize and compartmentalize the first electronic components and the second electrical components separately in or on the electronic circuit board of the hearing device.

In one or more example hearing devices, the electronic circuit board and/or the electronic circuit, in an un-folded state, extends along a longitudinal axis and a first plane crosses the longitudinal axis such that the one or more first electrical components are connected to, such as mounted on or in, the electronic circuit board on one side of the first plane and the one or more second electrical components are connected to, such as mounted on or in, the electronic circuit board on the other side of the first plane. In other words, the electronic components of the hearing device are divided in two groups of electrical components, such as a first group comprising or consisting of the first electrical components and a second group comprising or consisting of the second electrical components, where the first group is arranged on one side of the first plane and the second group is arranged on the other side of the first plane. It may be appreciated that the first electrical components and the second electrical components are divided or segregated on each side of the first plane. In one or more example hearing devices, the first plane may be substantially perpendicular to the longitudinal axis. An un-folded state of the electronic circuit board may be seen as an un-mounted state of the electronic circuit board and/or electronic circuit in the hearing device, such as un-mounted from a housing of the hearing device. In other words, an un-folded state may be seen as an un-bended electronic circuit board and/or electronic circuit. The longitudinal axis of the electronic circuit board may be seen as a longitudinal axis along which the electronic circuit board generally extends. The longitudinal axis of the electronic circuit board may be seen as the axis along which the largest dimension of the electronic circuit board extends.

In one or more example hearing devices, the electronic circuit board comprises a first bending region forming a first bend, wherein the first bend is formed between the first section and the second section. It may be appreciated that the first bend may be formed in a mounted state, such as folded state, of the electronic circuit board in the hearing device, e.g., in the housing of the hearing device. For example, the electronic circuit is accommodated in the housing by being folded or bended in an assembled state of the hearing device.

In one or more example hearing devices, the first bending region is deprived from electronic components. In one or more example hearing devices, the first section may comprise a first primary section and a first secondary section. In one or more example hearing devices, the first bend may be formed between the first primary section and a primary section as disclosed herein. It may be appreciated that the one or more first electrical components may be arranged on one side of the first bend and the one or more second electrical components may be arranged on the other side of the first bend. The first bending region may be seen as the portion of the electronic circuit board where the first bend is performed or created.

The first bend may start at the first section and end at the second section. The first bend may therefore separate the first section from the second section.

In one or more example hearing devices, the first bend has a bending in the range of 130° to 210°. It may be appreciated that, the first bend has a bending angle in the range of 130° to 210°. For example, the first bend has a bending in the range of 140° to 200°, such as 150° to 190°, preferably 160° to 190°, more preferably 175° to 185°, and for example 180°. The first bend may result in a part of the first section and a part of the second section facing substantially each other, such as a surface of the first section and a surface of the second section facing each other. The bending angle may be measured from a plane parallel with a surface of the first section or the second section.

In one or more example hearing devices, the second section comprises a primary region and a secondary region. The electronic circuit board comprises a second bending region forming a second bend, wherein the second bend is formed between the primary region and the secondary region.

It may be appreciated that the second bend may be formed in a mounted state, such as folded state, of the electronic circuit board in the hearing device, e.g., in the housing of the hearing device. For example, the electronic circuit is accommodated in the housing by being folded or bended in an assembled state of the hearing device.

In one or more example hearing devices, the second bending region is deprived from electronic components. In one or more example hearing devices, the second bend may be formed between the primary region and the secondary region. It may be appreciated that the one or more second electrical components may be arranged on or in the primary region and the secondary region. A primary part of the one or more second electrical components may be arranged on or in one side of the second bend and a secondary part of the one or more second electrical components may be arranged on or in the other side of the second bend.

The second bending region may be seen as the portion of the electronic circuit board where the second bend is performed or created.

The second bend may start at the primary region, such as start at an end of the primary region, and end at the secondary region, such as end at a beginning of the secondary region. The second bend may therefore separate the primary region from the secondary region.

In one or more example hearing devices, the electronic circuit, such as the electronic circuit board, is folded such that the first section, such as first primary section, is arranged between the primary region and the secondary region.

In one or more example hearing devices, the second bend has a bending in the range of 130° to 210°. It may be appreciated that, the second bend has a bending angle in the range of 130° to 210°. For example, the second bend has a bending in the range of 140° to 200°, such as 150° to 190°, preferably 160° to 190°, more preferably 175° to 185°, and for example 180°. The second bend may result in a part of the first section and a part of the primary region facing substantially each other, such as a first surface of the first section and a first surface of the primary region facing each other. The second bend may result in a part of the first section and a part of the secondary region facing substantially each other, such as a second surface of the first section and a first surface of the secondary region facing each other. The bending angle may be measured from a plane parallel with a surface of the first section or the second section. The second bend may result in a part of the first section being sandwiched between the primary region and the secondary region.

In one or more example hearing devices, the secondary region comprises a secondary first region and a secondary second region, and wherein the electronic circuit board comprises a third bending region forming a third bend, wherein the third bend is formed between the secondary first region and the secondary second region.

It may be appreciated that the third bend may be formed in a mounted state, such as folded state, of the electronic circuit board in the hearing device, e.g., in the housing of the hearing device. For example, the electronic circuit is accommodated in the housing by being folded or bended in an assembled state of the hearing device.

In one or more example hearing devices, the third bending region is deprived from electronic components. In one or more example hearing devices, the third bend may be formed between the secondary first region and the secondary second region. It may be appreciated that a secondary first part of the one or more second electrical components may be arranged on or in the secondary first region and a secondary second part of the one or more second electrical components may be arranged on or in the secondary second region. A secondary first part of the one or more second electrical components may be arranged on or in one side of the third bend and a secondary second part of the one or more second electrical components may be arranged on or in the other side of the third bend.

The third bending region may be seen as the portion of the electronic circuit board where the third bend is performed or created.

The third bend may start at the secondary first region, such as start at an end of the secondary first region, and end at the secondary second region, such as end at a beginning of the secondary second region. The third bend may therefore separate the secondary first region from the secondary second region.

In one or more example hearing devices, the electronic circuit, such as the electronic circuit board, is folded such that the first section, such as first primary section, is arranged between the primary region and the secondary region, such as the secondary first region, secondary second region, and secondary third region.

In one or more example hearing devices, the third bend has a bending in the range of 10° to 90°. It may be appreciated that, the third bend has a bending angle in the range of 10° to 90°. For example, the third bend has a bending in the range of 20° to 80°, such as 30° to 70°, preferably 40° to 60°, more preferably 40° to 50°, and for example 45°. The third bend may result in an upper part of the hearing device, such as the secondary second region, being wedge-shaped, which in turn reduces the size of the hearing device. The bending angle may be measured from a plane parallel with a surface of the secondary first region. The third bend may result in the voltage converter being shielded by the secondary second region.

In one or more example hearing devices, the secondary region comprises a secondary third region, and wherein the electronic circuit board comprises a fourth bending region forming a fourth bend, wherein the fourth bend is formed between the secondary second region and the secondary third region.

It may be appreciated that the fourth bend may be formed in a mounted state, such as folded state, of the electronic circuit board in the hearing device, e.g., in the housing of the hearing device. For example, the electronic circuit is accommodated in the housing by being folded or bended in an assembled state of the hearing device.

In one or more example hearing devices, the fourth bending region is deprived from electronic components. In one or more example hearing devices, the fourth bend may be formed between the secondary second region and the secondary third region. It may be appreciated that a secondary third part of the one or more second electrical components may be arranged on or in the secondary third region. A secondary second part of the one or more second electrical components may be arranged on or in one side of the fourth bend and a secondary third part of the one or more second electrical components may be arranged on or in the other side of the fourth bend.

The fourth bending region may be seen as the portion of the electronic circuit board where the fourth bend is performed or created.

The fourth bend may start at the secondary second region, such as start at an end of the secondary second region, and end at the secondary third region, such as end at a beginning of the secondary third region. The fourth bend may therefore separate the secondary second region from the secondary third region.

In one or more example hearing devices, the fourth bend has a bending in the range of 10° to 90°. It may be appreciated that, the fourth bend has a bending angle in the range of 10° to 90°. For example, the fourth bend has a bending in the range of 20° to 80°, such as 30° to 70°, preferably 40° to 60°, more preferably 40° to 50°, and for example 45°. The fourth bend may result in an upper part of the hearing device, such as the secondary second region, being wedge-shaped, which in turn reduces the size of the hearing device. The bending angle may be measured from a plane parallel with a surface of the secondary second region. The fourth bend may result in the voltage converter being shielded by the secondary second region and secondary third region.

In one or more example hearing devices, at least a part of the first section is sandwiched between the primary region and the secondary region. In one or more example hearing devices, the electronic circuit, such as the electronic circuit board, is folded such that the first section, such as first primary section, is arranged between the primary region and the secondary region. In other words, in an assembled state of the hearing device, at least a part of the first section is sandwiched between the primary region and the secondary region due to the first bend and/or the second bend. An advantage of having the first section sandwiched between the primary region and the secondary region is that the one or more second electrical components may be shielded, or at least partially shielded, from the one or more first electrical components. For example, the one or more second electrical components may be shielded from the power management components, such as shielded from the voltage converter.

In one or more example hearing devices, the first section comprises an electrical connector pad for connecting a battery. It may be appreciated that the battery provides power to the first section and the second section, e.g., via the first section. The first section and the second section may be electrically connected to each other, e.g., via the electronic circuit board. The electrical connector pad may comprise one or more electrical connector pads, e.g., for connecting the battery at one or more connection points on the first section. The battery may be soldered to the electronic circuit board via the first section and electrical connector pad. The first section may comprise a first tertiary section. The first tertiary section may be arranged between the first primary section and the first secondary region. The electrical connector pad may be arranged on or in the first tertiary section. Therefore, the electrical connector pad may be arranged between the first primary section and the first secondary section. In one or more example hearing devices, a fifth bend is formed between the first primary section and the first tertiary section. In one or more example hearing devices, a sixth bend is formed between the first secondary section and the first tertiary section.

An advantage of connecting the battery to the at or to the first section is that the hearing device may be divided in a first section having the first voltage and a second section having the second voltage. The first voltage may substantially be the voltage of the battery.

The battery may form part of the one or more first electrical components. The electrical connector pad may be seen as a connection area for the battery to be connected to the electronic circuit board. The electrical connector pad may be seen as a battery connector pad.

In one or more example hearing devices, the hearing device comprises a battery configured for providing a battery voltage, wherein the battery voltage is closer to the first voltage than to the second voltage. For example, the first voltage may be within 30% of the battery voltage, such as within 20% of the battery voltage or within 10% of the battery voltage. The battery voltage may for example be in the range of 3.5 V to 4.5 V, such as 4 V.

In one or more example hearing devices, the battery is electrically connected to the electronic circuit board via the electrical connector pad so that the battery is upstream from the first section and the second section is downstream from the first section.

In one or more example hearing devices, the one or more first electronic components comprise a voltage converter configured for step-down conversion from the battery voltage and/or the first voltage to the second voltage. In other words, the voltage converter is configured to step-down the battery voltage from the battery voltage to the first voltage, from the battery voltage to the second voltage, and/or from the first voltage to the second voltage. It may be appreciated that the one or more first electrical components may be arranged on one side of the voltage converter and the one or more second electrical components may be arranged on the other side of the voltage converter. For example, the voltage converter may be arranged or located between an end portion of the first section and a beginning portion of the second section. The voltage converter may form part of one or more power management components.

A voltage converter may be seen as a voltage regulator or power converter. The voltage converter may be seen as an electronic device or circuit that transforms the electrical potential difference (voltage) from one level to another. The voltage converters function may be to convert the voltage of a power source, e.g., the battery, to a different voltage level required by a particular electronic device or system.

The voltage converter may be used to ensure compatibility between different electrical systems or devices. The voltage converter may enable the efficient transfer of electrical power while maintaining a consistent and stable voltage output.

In one or more example hearing devices, the voltage converter may be a step-down voltage converter (such as Buck Converter). This type of converter reduces the input voltage to a lower output voltage level. It is used when the target device or system operates at a voltage lower than the available input source. For example, the one or more second electrical components operating at lower second voltage than the first voltage of the one or more first electrical components.

In one or more example hearing devices, the voltage converter may be a step-up voltage converter (such as Boost Converter). This type of converter increases the input voltage to a higher output voltage level. It is used when the target device or system requires a higher voltage than the available input source. For example, the one or more second electrical components operating at higher second voltage than the first voltage of the one or more first electrical components.

In one or more example hearing devices, the one or more second electronic components comprise one or more processors. The one or more processors may be arranged on or in the first surface of the primary region and may be arranged between the first section and the primary region.

The first primary region of the electronic circuit board may shield one or more processors of the second section from the voltage converter mounted in or on the first section, such as shield one or more processors mounted on or in the primary region of the second section from the voltage converter mounted on or in the first primary section. For example, by having the first section sandwiched between the primary region and the secondary region, the one or more second electrical components may be shielded, or at least partially shielded, from the one or more first electrical components. By having the voltage converter mounted on or in the second surface of the first section, such as the second surface of the first primary section or region, the portion of circuit board of the first primary section may shield the one or more processors from the voltage converter, since a portion of circuit board is arranged between the voltage converter and the one or more processors.

The voltage converter may comprise a shielding layer, such as a shielding casing, enclosing at least partially the voltage converter. The combination of the shielding layer and the arrangement of the electronic circuit board provides an improved shielding of the one or more second electrical components from the one or more first electrical components and a reduced exposure to electrical noise, e.g., noise from the voltage converter.

In one or more example hearing devices, at least some of the one or more first electronic components are provided with a corrosion protection coating. The corrosion protection coating may be seen as a corrosion protective sealing applied on at least some of the one or more first electrical components. It may be appreciated that first electronic components being located in or on the first section are operating at higher voltage than the second electrical components are more exposed to the risk of corrosion. Therefore, the corrosion protective coating may protect the first electrical components that are the most exposed to corrosion.

In one or more example hearing devices, the one or more first electronic components comprise a command button. The command button may be seen as a power switch.

For example, the one or more first electrical components may comprise a power switch located close to the battery and which interfaces with an exterior of the hearing device, e.g., such that a user can turn on and off the hearing device. The power switch may be especially exposed to corrosion risk and is therefore coated with a corrosion protection coating. It may be appreciated that the corrosion protective layer is in addition to existing protective layer(s) of the electronic circuit. The arrangement of the electronic circuit board and/or electronic circuit in a mounted state of the hearing device allows to isolate the electronic components operating at higher voltage and being closer to the battery, and in turn minimize the number of electronic components exposed to corrosion risk and protect the electronic components being exposed to higher corrosion risk.

In one or more example hearing devices, the one or more second electronic components comprise an output transducer connector arranged at the primary region and an input transducer arranged at the secondary region. An output transducer connector may be configured to connect to one or more output transducers of the hearing device. It may be appreciated that the output transducer connector may be configured to be connected to an earpiece part of the hearing device comprising the output transducer(s). An output transducer may be seen as a receiver and/or a speaker of the hearing device. The arrangement of the output transducer connector at the primary region allows to have the output transducer facing an exterior of the hearing device which in turn improves the accessibility of the output transducer connector while reducing the size of the hearing device and providing a compact hearing device. This may also reduce the size of the housing of the hearing device. The output transducer connector may be arranged at a second surface of the primary region.

The one or more second electrical components may comprise one or more input transducers arranged at the secondary region. An input transducer may be seen as a microphone as disclosed herein.

In one or more example hearing devices, the one or more second electronic components comprise a first microphone and a second microphone.

For example, the hearing device may comprise a rear microphone and a front microphone being the first microphone and the second microphone respectively. The arrangement of the input transducer at the secondary region allows to have the input transducer arranged on or in the first surface of the secondary region which in turn improves the properties of the input transducer while reducing the size of the hearing device and providing a compact hearing device (see for example FIG. 4). This may also reduce the size of the housing of the hearing device. The rear microphone may be arranged on or in the secondary first region and the front microphone may be arranged on or in the secondary third region.

An electronic circuit is disclosed. The electronic circuit may be for a hearing device as disclosed herein. The electronic circuit comprises an electronic circuit board, such as an electronic circuit board as disclosed herein comprising a first section and a second section; one or more first electronic components configured to operate at a first voltage, the one or more first electronic components being mounted on or in the first section; and one or more second electronic components configured to operate at a second voltage, the one or more second electronic components being mounted on or in the second section; wherein the second voltage is lower than the first voltage and wherein the first section is separate from the second section.

Also disclosed is an electronic circuit board, such as an electronic circuit board for a hearing device as disclosed herein. The electronic circuit board comprises a first section comprising a plurality of first electrical connector pads for mounting one or more first electronic components; a second section comprising a plurality of second electrical connector pads for mounting one or more second electronic components; wherein the plurality of first electrical connector pads are configured to be connected to the one or more first electrical components operating at a first voltage and the plurality of second electrical connector pads are configured to be connected to the one or more second electrical components operating at a second voltage, wherein the second voltage is lower than the first voltage and wherein the first section is separate from the second section.

It may be appreciated that an electronic circuit as disclosed herein may comprise an electronic circuit board as disclosed herein, and one or more electronic components as disclosed herein. Whenever reference is made to a section, it may be understood as comprising a respective region of an electronic circuit board and the electronic component(s) configured to be mounted on or in that region. Whenever reference is made to region, it may be understood as comprising a region of the electronic circuit board but without the electronic component(s).

A method of manufacturing an electronic circuit of or for a hearing device is disclosed, the method comprising providing an electronic circuit board; mounting one or more electronic components on or in a first section of the electronic circuit board; mounting one or more second electronic components on or in a second section of the electronic circuit board; wherein the one or more first electronic components are configured to operate at a first voltage and the one or more second electronic components are configured to operate at a second voltage, wherein the second voltage is lower than the first voltage and wherein the first section is separate from the second section, e.g., the one or more first electronic components are separate from the one or more second electronic components. It may be appreciated that a method of manufacturing a hearing device is disclosed comprising the steps of the method of manufacturing an electronic circuit as disclosed herein.

It is to be understood that a description of a feature in relation to hearing device(s) is also applicable to the corresponding feature in electronic circuit/electronic circuit board/method and vice versa.

FIG. 1 schematically illustrates an example electronic circuit, such as electronic circuit 6, for a hearing device according to the disclosure, such as hearing device 2. FIG. 1 shows a perspective view of an example electronic circuit in an un-folded state. It may be appreciated that FIG. 1 shows a perspective view of an example hearing device in an un-folded or un-assembled state.

The hearing device 2 is configured for being worn at an ear of a user. In one or more example hearing devices, the hearing device 2 comprises a memory, one or more interfaces (such as one or more wired interfaces and/or one or more wireless interfaces, e.g., one or more of: electrical connector pad 38, output transducer connector 42, command button 44, charger coil connector pad 52, and one or more antennas 62), one or more processors (such as one or more processors 46), one or more microphones (such as first input transducer 48 and/or second input transducer 50), and one or more receivers and/or speakers. The hearing device 2 may be a hearable or a hearing aid, wherein the one or more processors may be configured to compensate for a hearing loss of a user. In one or more example hearing devices, the hearing device may be seen as an audio device, such as a headset.

The hearing device 2, such as the electronic circuit 6, comprises an electronic circuit board 8 comprising a first section 10 and a second section 12. The hearing device 2 comprises one or more electronic components mounted in or on the electronic circuit board 8. In one or more example hearing devices, the hearing device comprises a housing configured to house the electronic circuit as disclosed herein. The housing is not shown in the figures. The electronic circuit board 8, such as the electronic circuit 6, comprises a first surface S1 and a second surface S2.

The first section 10 may be seen as a defined first portion of the electronic circuit board 8, such as a first delimitated area of the electronic circuit board 8. The first section 10 may be seen as a first subdivision of the electronic circuit board 8. The second section 12 may be seen as a defined second portion of the electronic circuit board 8, such as a second delimitated area of the electronic circuit board 8. The second section 12 may be seen as a second subdivision of the electronic circuit board 8.

In one or more example hearing devices, the power wiring of the electronic circuit board 8 is arranged in one single layer. An advantage of separating the first section 10 and the second section 12, such as separating the one or more first electrical components and the one or more second electrical components, is that the power wiring of the electronic circuit board 8 may be arranged in one single layer of the electronic circuit board 8, such as one single layer of the electronic circuit 6.

An advantage of the present disclosure is therefore that fewer layers are required in the electronic circuit board and in turn thinner and more flexible electronic circuit boards may be provided.

The hearing device 2, such as the electronic circuit 6, comprises one or more first electronic components configured to operate at a first voltage.

The one or more first electronic components are mounted on or in the first section 10.

The hearing device 2, such as the electronic circuit 6, comprises one or more second electronic components configured to operate at a second voltage.

The one or more second electronic components are mounted on or in the second section 12. The second voltage is lower than the first voltage. The first section 10 is separate from the second section 12. In other words, the electronic circuit board 8 of the hearing device 2 is divided in a first section 10 and a second section 12 which are separate from each other. For example, by separating the first section 10 from the second section 12 it allows to organize and compartmentalize the electronic components of the hearing device 2, such as to organize and compartmentalize the first electronic components and the second electrical components separately in or on the electronic circuit board 8 of the hearing device 2.

In one or more example hearing devices, the second section 12 comprises a primary region 20 and a secondary region 22. The electronic circuit board 8 comprises a second bending region 8 forming a second bend (second bend 33 of FIGS. 3-4), wherein the second bend 33 is formed between the primary region 20 and the secondary region 22.

It may be appreciated that the second bend 33 may be formed in a mounted state, such as folded state, of the electronic circuit board 8 in the hearing device 2, e.g., in the housing of the hearing device 2. For example, the electronic circuit 6 is accommodated in the housing by being folded or bended in an assembled state of the hearing device 2.

In one or more example hearing devices, the second bending region 32 is deprived from electronic components. In one or more example hearing devices, the second bending region 32 comprises one or more electronic components, such as second electrical components arranged in or on the second bending region 32. In one or more example hearing devices, the second bend 33 may be formed between the primary region 20 and the secondary region 22. It may be appreciated that the one or more second electrical components may be arranged on or in the primary region 20 and the secondary region 22. A primary part of the one or more second electrical components may be arranged on or in one side of the second bend 33 and a secondary part of the one or more second electrical components may be arranged on or in the other side of the second bend 33.

The second bending region 32 may be seen as the portion of the electronic circuit board 8 where the second bend 33 is performed or created.

The second bend 33 may start at the primary region 20, such as start at an end of the primary region 20, and end at the secondary region 22, such as end at a beginning of the secondary region 22. The second bend 33 may therefore separate the primary region 20 from the secondary region 22.

Figure 3:
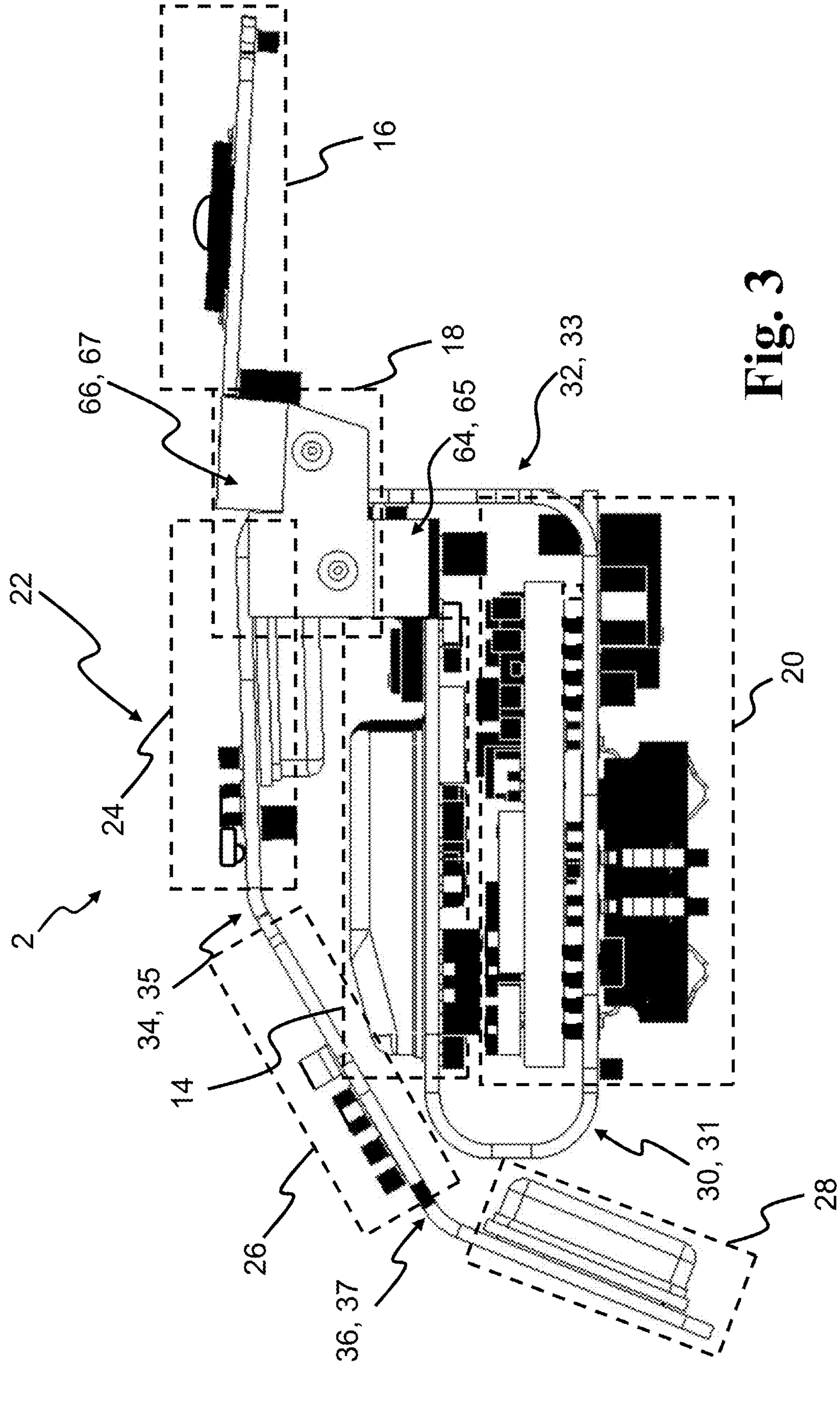
Figure 4:
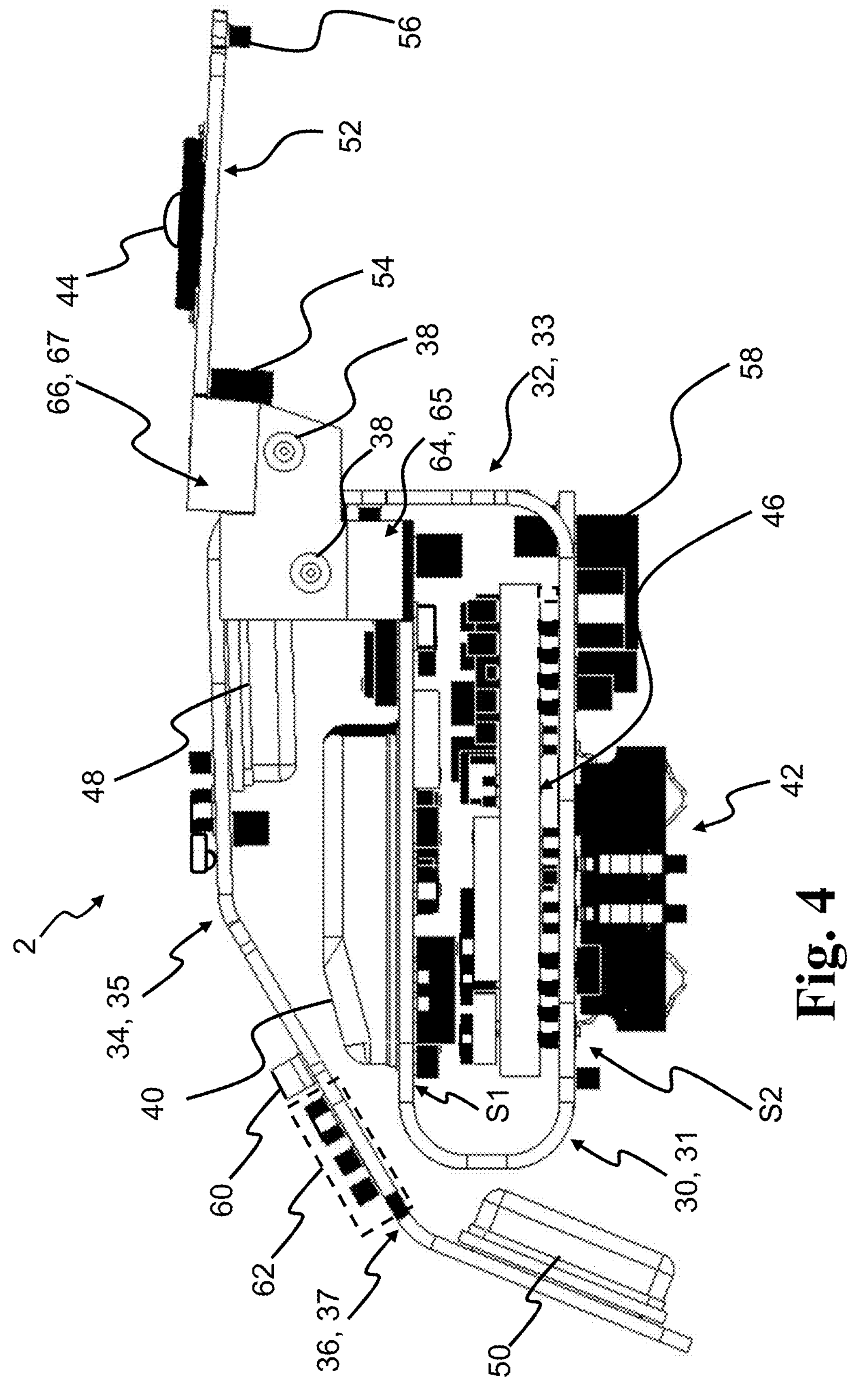

In one or more example hearing devices, the electronic circuit 6, such as the electronic circuit board 8, is folded such that the first section 10, such as first primary section 14, is arranged between the primary region 20 and the secondary region 22 (see FIGS. 3-4).

In one or more example hearing devices, the secondary region 22 comprises a secondary first region 24 and a secondary second region 26, and wherein the electronic circuit board 8 comprises a third bending region 34 (see FIGS. 2-4) forming a third bend (see third bend 35 of FIGS. 3-4), wherein the third bend 35 is formed between the secondary first region 24 and the secondary second region 26.

It may be appreciated that the third bend 35 may be formed in a mounted state, such as folded state, of the electronic circuit board 8 in the hearing device 2, e.g., in the housing of the hearing device 2. For example, the electronic circuit 6 is accommodated in the housing by being folded or bended in an assembled state of the hearing device 2.

In one or more example hearing devices, the third bending region 34 is deprived from electronic components. In one or more example hearing devices, the third bend 35 may be formed between the secondary first region 24 and the secondary second region 26. It may be appreciated that a secondary first part of the one or more second electrical components may be arranged on or in the secondary first region 24 and a secondary second part of the one or more second electrical components may be arranged on or in the secondary second region 26. A secondary first part of the one or more second electrical components may be arranged on or in one side of the third bend 35 and a secondary second part of the one or more second electrical components may be arranged on or in the other side of the third bend 35.

The third bending region 34 may be seen as the portion of the electronic circuit board 8 where the third bend 34 is performed or created.

The third bend 34 may start at the secondary first region 24, such as start at an end of the secondary first region 24, and end at the secondary second region 26, such as end at a beginning of the secondary second region 26. The third bend 35 may therefore separate the secondary first region 24 from the secondary second region 26.

In one or more example hearing devices, the electronic circuit 6, such as the electronic circuit board 8, is folded such that the first section 10, such as first primary section 14, is arranged between the primary region 20 and the secondary region 22, such as the secondary first region 24, secondary second region 26, and secondary third region 28.

In one or more example hearing devices, the secondary region 22 comprises a secondary third region 28, and wherein the electronic circuit board 8 comprises a fourth bending region 36 forming a fourth bend 37, wherein the fourth bend 37 is formed between the secondary second region 26 and the secondary third region 28.

It may be appreciated that appreciated that the fourth bend 37 may be formed in a mounted state, such as folded state, of the electronic circuit board 8 in the hearing device 2, e.g., in the housing of the hearing device 2. For example, the electronic circuit 6 is accommodated in the housing by being folded or bended in an assembled state of the hearing device 2.

In one or more example hearing devices, the fourth bending region 36 is deprived from electronic components. In one or more example hearing devices, the fourth bend 37 may be formed between the secondary second region 26 and the secondary third region 28. It may be appreciated that a secondary third part of the one or more second electrical components may be arranged on or in the secondary third region 28. A secondary second part of the one or more second electrical components may be arranged on or in one side of the fourth bend 37 and a secondary third part of the one or more second electrical components may be arranged on or in the other side of the fourth bend 37.

The fourth bending region 36 may be seen as the portion of the electronic circuit board 8 where the fourth bend 37 is performed or created.

The fourth bend 37 may start at the secondary second region 26, such as start at an end of the secondary second region 26, and end at the secondary third region 28, such as end at a beginning of the secondary third region 28. The fourth bend 37 may therefore separate the secondary second region 26 from the secondary third region 28.

Figure 2:
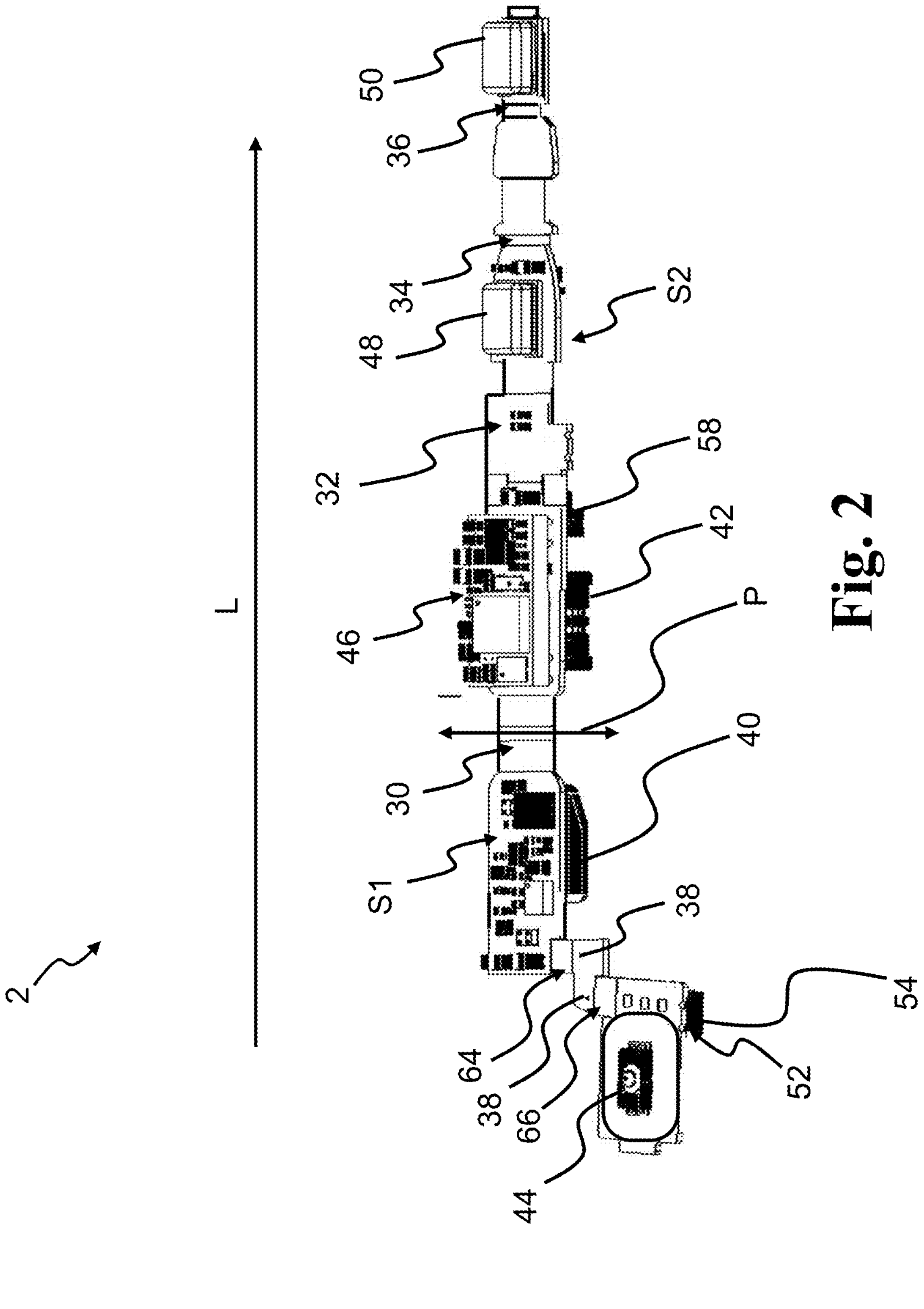

FIG. 2 schematically illustrates an example electronic circuit, such as electronic circuit 6, for a hearing device according to the disclosure, such as hearing device 2. FIG. 2 shows the same example electronic circuit as in FIG. 1, but where different features are described. It may be appreciated that FIG. 1 may comprise some or all of the features described in FIG. 2 and vice-versa. As in FIG. 1, FIG. 2 also shows a perspective view of an example electronic circuit in an un-folded state. It may be appreciated that FIG. 2 shows a perspective view of an example hearing device in an un-folded or un-assembled state.

In one or more example hearing devices, the electronic circuit board 8 and/or the electronic circuit 6, in an un-folded state, extends along a longitudinal axis L and a first plane P crosses the longitudinal axis L such that the one or more first electrical components are connected to, such as mounted on or in, the electronic circuit board 8 on one side of the first plane P and the one or more second electrical components are connected to, such as mounted on or in, the electronic circuit board 8 on the other side of the first plane P. In other words, the electronic components of the hearing device 2 are divided in two groups of electrical components, such as a first group comprising or consisting of the first electrical components and a second group comprising or consisting of the second electrical components, where the first group is arranged on one side of the first plane P and the second group is arranged on the other side of the first plane P. It may be appreciated that the first electrical components and the second electrical components are divided or segregated on each side of the first plane P. In one or more example hearing devices, the first plane P may be substantially perpendicular to the longitudinal axis L. An un-folded state of the electronic circuit board 8 may be seen as an un-mounted state of the electronic circuit board 8 and/or electronic circuit 6 in the hearing device 2, such as un-mounted from a housing of the hearing device 2. In other words, an un-folded state may be seen as an un-bended electronic circuit board 8 and/or electronic circuit 6. The longitudinal axis L of the electronic circuit board 8 may be seen as a longitudinal axis along which the electronic circuit board 8 generally extends. The longitudinal axis L of the electronic circuit board 8 may be seen as the axis along which the largest dimension of the electronic circuit board 8 extends.

In one or more example hearing devices, the electronic circuit board 8 comprises a first bending region 30 forming a first bend (see first bend 31 of FIG. 3 in a folded state of the electronic circuit 6), wherein the first bend 31 is formed between the first section 10 and the second section 12. It may be appreciated that the first bend 31 may be formed in a mounted state, such as folded state, of the electronic circuit board 8 in the hearing device 2, e.g., in the housing (not shown) of the hearing device 2. For example, the electronic circuit 6 is accommodated in the housing by being folded or bended in an assembled state of the hearing device 2.

In one or more example hearing devices, the first bending region 30 is deprived from electronic components. In one or more example hearing devices, the first section 10 may comprise a first primary section (see first primary section 14 of FIG. 1) and a first secondary region/section (see first primary section 16 of FIG. 1). In one or more example hearing devices, the first bend 31 may be formed between the first primary section 14 and a primary region/section (see primary region/section 20 of FIG. 1) as disclosed herein. It may be appreciated that the one or more first electrical components may be arranged on one side of the first bend 31 and the one or more second electrical components may be arranged on the other side of the first bend 31. The first bending region 30 may be seen as the portion of the electronic circuit board 8 where the first bend 31 is performed or created.

The first bend 31 may start at the first section 10 and end at the second section 12. The first bend 31 may therefore separate the first section 10 from the second section 12.

In one or more example hearing devices, the first section 10 comprises an electrical connector pad 38 (such as one or more electrical connector pads 38) for connecting a battery (not shown). It may be appreciated that the battery is configured to provide power to the first section 10 and the second section 12, e.g., via the first section 10, such as via the voltage converter 40. The electrical connector pad may be arranged at the first surface S1 and/or the second surface S2 of the electronic circuit board 8. The first section 10 and the second section 12 may be electrically connected to each other, e.g., via the electronic circuit board 8. The electrical connector pad 38 may comprise one or more electrical connector pads, e.g., for connecting the battery at one or more connection points on the first section 10. The battery may be soldered to the electronic circuit board 8 via the first section 10 and electrical connector pad 38. The first section 10 may comprise a first tertiary section 18. The first tertiary section 18 may be arranged between the first primary section 14 and the first secondary region 16. The electrical connector pad 38 may be arranged on or in the first tertiary section 18. Therefore, the electrical connector pad 38 may be arranged between the first primary section 14 and the first secondary section 16. In one or more example hearing devices, a fifth bend 65 is formed between the first primary section 14 and the first tertiary section 18. In one or more example hearing devices, a sixth bend 67 is formed between the first secondary section 16 and the first tertiary section 18. In other words, the electronic circuit board 8 may comprise a fifth bending region 64 and a sixth bending region 66. The description associated with a bending region, such as the first bending region 30, the second bending region 32 etc., may also apply to the fifth bending region 64 and sixth bending region 66.

An advantage of connecting the battery to the at or to the first section 10 is that the hearing device 2 may be divided in a first section 10 having the first voltage and a second section 12 having the second voltage. The first voltage may substantially be the voltage of the battery.

The battery may form part of the one or more first electrical components. The electrical connector pad 38 may be seen as a connection area for the battery to be connected to the electronic circuit board 8. The electrical connector pad 38 may be seen as a battery connector pad.

In one or more example hearing devices, the battery is configured to be electrically connected to the electronic circuit board 8 via the electrical connector pad 38 so that the battery is upstream from the first section 10 and the second section 12 is downstream from the first section 10.

In one or more example hearing devices, the one or more first electronic components comprise a voltage converter 40 configured for step-down conversion from the battery voltage and/or the first voltage to the second voltage. It may be appreciated that the one or more first electrical components may be arranged on one side of the voltage converter 40 and the one or more second electrical components may be arranged on the other side of the voltage converter 40. For example, the voltage converter 40 may be arranged or located between an end portion of the first section 10 and a beginning portion of the second section 12. The voltage converter 40 may form part of one or more power management components. In FIGS. 1-4 the voltage converter 40 is shown shielded with a shielding cover.

In one or more example hearing devices, the one or more second electronic components comprise one or more processors 46. The one or more processors 46 may be arranged on or in the first surface S1 of the primary region 20 and may be arranged between the first section 10 and the primary region 20.

The first primary region 14 of the electronic circuit board 8 may shield the one or more processors 46 of the second section 12 from the voltage converter 40 mounted in or on the first section 10, such as shield one or more processors 46 mounted on or in the primary region 20 of the second section 12 from the voltage converter 40 mounted on or in the first primary section 14. For example, by having the first section 10 sandwiched between the primary region 20 and the secondary region 22, the one or more second electrical components may be shielded, or at least partially shielded, from the one or more first electrical components. By having the voltage converter 40 mounted on or in the second surface S2 of the first section 10, such as the second surface S2 of the first primary section 14 or region, the portion of circuit board 8 of the first primary section 14 may shield the one or more processors 46 from the voltage converter 40, since a portion of circuit board 8 is arranged between the voltage converter 40 and the one or more processors 46.

The voltage converter 40 may comprise a shielding layer, such as a shielding casing, enclosing at least partially the voltage converter. The combination of the shielding layer and the arrangement of the electronic circuit board 8 provides an improved shielding of the one or more second electrical components from the one or more first electrical components and a reduced exposure to electrical noise, e.g., noise from the voltage converter 40.

In one or more example hearing devices, at least some of the one or more first electronic components are provided with a corrosion protection coating. The corrosion protection coating may be seen as a corrosion protective sealing applied on at least some of the one or more first electrical components. It may be appreciated that first electronic components being located in or on the first section are operating at higher voltage than the second electrical components are more exposed to the risk of corrosion. Therefore, the corrosion protective coating may protect the first electrical components that are the most exposed to corrosion.

In one or more example hearing devices, the one or more first electronic components comprise a command button 44. The command button 44 may be seen as a power switch.

For example, the one or more first electrical components may comprise a power switch located close to the battery and which interfaces with an exterior of the hearing device 2, e.g., such that a user can turn on and off the hearing device 2. The power switch may be especially exposed to corrosion risk and is therefore coated with a corrosion protection coating. It may be appreciated that the corrosion protective layer is in addition to existing protective layer(s) of the electronic circuit 6. The arrangement of the electronic circuit board 8 and/or electronic circuit 6 in a mounted state of the hearing device 2 allows to isolate the electronic components operating at higher voltage and being closer to the battery, and in turn minimize the number of electronic components exposed to corrosion risk and protect the electronic components being exposed to higher corrosion risk. The command button may be arranged at a first surface S1 of the electronic circuit board 8.

In one or more example hearing devices, the one or more second electronic components comprise an output transducer connector 42 arranged at the primary region 20 and an input transducer, such as a first input transducer 48 and/or a second input transducer 50, arranged at the secondary region 22. The arrangement of the output transducer connector 42 at the primary region 20 allows to have the output transducer facing an exterior of the hearing device 2 which in turn improves the accessibility of the output transducer connector 42 while reducing the size of the hearing device 2 and providing a compact hearing device 2. This may also reduce the size of the housing of the hearing device 2. The output transducer connector 42 may be arranged at a second surface S2 of the primary region 20.

The one or more second electrical components may comprise one or more input transducers, such as a first input transducer 48 and/or a second input transducer 50, arranged at the secondary region 22. An input transducer may be seen as a microphone as disclosed herein.

In one or more example hearing devices, the one or more second electronic components comprise a first microphone and a second microphone, such as a first input transducer 48 and a second input transducer 50 respectively.

For example, the hearing device 2 may comprise a rear microphone and a front microphone being the first microphone and the second microphone respectively. The arrangement of the input transducer at the secondary region 22 allows to have the input transducer arranged on or in the first surface S1 of the secondary region 22 which in turn improves the properties of the input transducer while reducing the size of the hearing device 2 and providing a compact hearing device (see for example FIG. 4 with the electronic circuit 6 in a folded state). This may also reduce the size of the housing of the hearing device 2. The rear microphone 48 may be arranged on or in the secondary first region 24 and the front microphone 50 may be arranged on or in the secondary third region 28.

FIG. 3 schematically illustrates an example electronic circuit, such as electronic circuit 6, for a hearing device according to the disclosure, such as hearing device 2. FIG. 3 shows the same example electronic circuit as in FIG. 1 and FIG. 2, but where the electronic circuit is in a folded state or assembled state. It may be appreciated that FIG. 3 may comprise some or all of the features described in FIGS. 1-2 and vice-versa. FIG. 3 shows a perspective view of an example electronic circuit in a folded state. It may be appreciated that FIG. 3 shows a perspective view of an example hearing device in a folded or assembled state.

In one or more example hearing devices, at least a part of the first section 10 is sandwiched between the primary region 20 and the secondary region 22. In one or more example hearing devices, the electronic circuit 6, such as the electronic circuit board 8, is folded such that the first section 10, such as first primary section 14, is arranged between the primary region 20 and the secondary region 22. In other words, in an assembled state of the hearing device 2, at least a part of the first section 10 is sandwiched between the primary region 20 and the secondary region 22 due to the first bend 31 and/or the second bend 33. An advantage of having the first section 10 sandwiched between the primary region 20 and the secondary region 22 is that the one or more second electrical components may be shielded, or at least partially shielded, from the one or more first electrical components. For example, the one or more second electrical components may be shielded from the power management components, such as shielded from the voltage converter, such as shielded from the voltage converter 40.

In one or more example hearing devices, the first bend 31 has a bending in the range of 130° to 210°. It may be appreciated that, the first bend 31 has a bending angle in the range of 130° to 210°. For example, the first bend 31 has a bending in the range of 140° to 200°, such as 150° to 190°, preferably 160° to 190°, more preferably 175° to 185°, and for example 180°. In FIGS. 3-4 the first bend 31 has a bending of approximately 180°. The first bend 31 may result in a part of the first section 10 and a part of the second section 12 facing substantially each other, such as a surface of the first section 10 and a surface of the second section 12 facing each other. The bending angle may be measured from a plane parallel with a surface of the first section 10 or the second section 12.

In one or more example hearing devices, the second bend 33 has a bending in the range of 130° to 210°. It may be appreciated that the second bend 33 has a bending angle in the range of 130° to 210°. For example, the second bend 33 has a bending in the range of 140° to 200°, such as 150° to 190°, preferably 160° to 190°, more preferably 175° to 185°, and for example 180°. The second bend 33 may result in a part of the first section 10 and a part of the primary region 20 facing substantially each other, such as a first surface S1 of the first section 10 and a first surface S1 of the primary region 20 facing each other. The second bend 33 may result in a part of the first section 10 and a part of the secondary region 22 facing substantially each other, such as a second surface S2 of the first section 10 and a first surface S1 of the secondary region 22 facing each other. The bending angle may be measured from a plane parallel with a surface of the first section 10 or the second section 12. The second bend 33 may result in a part of the first section 10 being sandwiched between the primary region 20 and the secondary region 22.

In one or more example hearing devices, the third bend 35 has a bending in the range of 10° to 90°. It may be appreciated that, the third bend 35 has a bending angle in the range of 10° to 90°. For example, the third bend 35 has a bending in the range of 20° to 80°, such as 30° to 70°, preferably 40° to 60°, more preferably 40° to 50°, and for example 45°. The third bend 33 may result in an upper part of the hearing device 2, such as the secondary second region 26, being wedge-shaped, which in turn reduces the size of the hearing device 2. The bending angle may be measured from a plane parallel with a surface of the secondary first region 24. The third bend 35 may result in the voltage converter 40 being shielded by the secondary first region 24, the secondary second region 26, and/or the secondary third region 28.

In one or more example hearing devices, the fourth bend 37 has a bending in the range of 10° to 90°. It may be appreciated that, the fourth bend 37 has a bending angle in the range of 10° to 90°. For example, the fourth bend 37 has a bending in the range of 20° to 80°, such as 30° to 70°, preferably 40° to 60°, more preferably 40° to 50°, and for example 45°. The fourth bend 37 may result in an upper part of the hearing device 2, such as the secondary second region 26, being wedge-shaped, which in turn reduces the size of the hearing device 2. The bending angle may be measured from a plane parallel with a surface of the secondary second region 26. The fourth bend 37 may result in the voltage converter 40 being shielded by the secondary second region 26 and secondary third region 28.

FIG. 4 schematically illustrates an example electronic circuit, such as electronic circuit 6, for a hearing device according to the disclosure, such as hearing device 2. FIG. 4 shows the same example electronic circuit as in FIG. 3, but where different features are described. It may be appreciated that FIG. 3 may comprise some or all of the features described in FIG. 4 and vice-versa. FIG. 4 shows the same example electronic circuit as in FIG. 1 and FIG. 2, but where the electronic circuit is in a folded state or assembled state. It may be appreciated that FIG. 4 may comprise some or all of the features described in FIGS. 1-2 and vice-versa. FIG. 4 shows a perspective view of an example electronic circuit in a folded state. It may be appreciated that FIG. 4 shows a perspective view of an example hearing device in a folded or assembled state.

Exemplary methods, hearing devices, electronic circuit boards, and electronic circuits according to the disclosure are set out in the following items:

Item 1. A hearing device configured for being worn at an ear of a user, the hearing device comprising:

- an electronic circuit board comprising a first section and a second section;
- one or more first electronic components configured to operate at a first voltage, the one or more first electronic components being mounted on or in the first section; and
- one or more second electronic components configured to operate at a second voltage, the one or more second electronic components being mounted on or in the second section;

wherein the second voltage is lower than the first voltage and wherein the first section is separate from the second section.

Item 2. The hearing device according to item 1, wherein the electronic circuit board, in an un-folded state, extends along a longitudinal axis and a first plane crosses the longitudinal axis such that the one or more first electrical components are connected to the circuit board on one side of the first plane and the one or more second electrical components are connected to the circuit board on the other side of the first plane.

Item 3. The hearing device according to any of the previous items, wherein the circuit board comprises a first bending region forming a first bend, wherein the first bend is formed between the first section and the second section.

Item 4. The hearing device according to item 3, wherein the second section comprises a primary region and a secondary region, and wherein the electronic circuit board comprises a second bending region forming a second bend, wherein the second bend is formed between the primary region and the secondary region.

Item 5. The hearing device according to item 4, wherein at least a part of the first section is sandwiched between the primary region and the secondary region.

Item 6. The hearing device according to any of the previous items, wherein the first section comprises an electrical connector pad for connecting a battery.

Item 7. The hearing device according to any of the previous items, wherein the hearing device comprises a battery configured for providing a battery voltage, wherein the battery voltage is closer to the first voltage than to the second voltage.

Item 8. The hearing device according to items 6 and 7 as dependent on item 6, wherein the battery is electrically connected to the electronic circuit board via the electrical connector pad so that the battery is upstream from the first section and the second section is downstream from the first section.

Item 9. The hearing device according to any of the previous items, wherein the one or more first electronic components comprise a voltage converter configured for step-down conversion from the battery voltage and/or the first voltage to the second voltage.

Item 10. The hearing device according to any of the previous items, wherein at least some of the one or more first electronic components are provided with a corrosion protection coating.

Item 11. The hearing device according to any of the previous items when dependent on item 5, wherein the one or more second electronic components comprise an output transducer connector arranged at the primary region and an input transducer arranged at the secondary region.

Item 12. The hearing device according to any of the previous items, wherein the one or more first electronic components comprise a command button.

Item 13. The hearing device according to any of the previous items, wherein the power wiring of the electronic circuit board is arranged in one single layer.

Item 14. The hearing device according to any of the previous items, wherein the electronic circuit board is a 4-layer or 5-layer circuit board.

Item 15. The hearing device according to any of the previous items, wherein the first voltage is in the range of 3.5 V to 4.5 V.

Item 16. The hearing device according to any of the previous items, wherein the second voltage is in the range of 0.5 V to 2.0 V.

Item 17. The hearing device according to any of items 3-15, wherein the first bend has a bending in the range of 130° to 210°.

Item 18. The hearing device according to any of items 4-16, wherein the second bend has a bending in the range of 130° to 210°.

Item 19. The hearing device according to any of items 4-18, wherein the secondary region comprises a secondary first region and a secondary second region, and wherein the electronic circuit board comprises a third bending region forming a third bend, wherein the third bend is formed between the secondary first region and the secondary second region.

Item 20. The hearing device according to item 19, wherein the third bend has a bending in the range of 10° to 90°.

Item 21. The hearing device according to any of items 4-20, wherein the secondary region comprises a secondary third region, and wherein the electronic circuit board comprises a fourth bending region forming a fourth bend, wherein the fourth bend is formed between the secondary third region and the secondary second region.

Item 22. The hearing device according to any of the previous items, wherein the one or more second electronic components comprise a first microphone and a second microphone.

Item 23. The hearing device according to any of the previous items, wherein the one or more second electronic components comprise one or more processors.

Item 24. An electronic circuit for a hearing device, the electronic circuit comprising:
- an electronic circuit board comprising a first section and a second section;
- one or more first electronic components configured to operate at a first voltage, the one or more first electronic components being mounted on or in the first section; and
- one or more second electronic components configured to operate at a second voltage, the one or more second electronic components being mounted on or in the second section;
- wherein the second voltage is lower than the first voltage and wherein the first section is separate from the second section.

Item 25. An electronic circuit board for a hearing device, the electronic circuit board comprising:
- a first section comprising a plurality of first electrical connector pads for mounting one or more first electronic components;
- a second section comprising a plurality of second electrical connector pads for mounting one or more second electronic components;
- wherein the plurality of first electrical connector pads is configured to be connected to the one or more first electrical components operating at a first voltage and the plurality of second electrical connector pads are configured to be connected to the one or more second electrical components operating at a second voltage, wherein the second voltage is lower than the first voltage and wherein the first section is separate from the second section.

Item 26. A method of manufacturing an electronic circuit for a hearing device, the method comprising:
- providing an electronic circuit board;
- mounting one or more first electronic components on or in a first section of the electronic circuit board;
- mounting one or more second electronic components on or in a second section of the electronic circuit board;
- wherein the one or more first electronic components are configured to operate at a first voltage and the one or more second electronic components are configured to operate at a second voltage, wherein the second voltage is lower than the first voltage and wherein the first section is separate from the second section.

The use of the terms “first”, “second”, “third” and “fourth”, “primary”, “secondary”, “tertiary” etc. does not imply any particular order, but are included to identify individual elements. Moreover, the use of the terms “first”, “second”, “third” and “fourth”, “primary”, “secondary”, “tertiary” etc. does not denote any order or importance, but rather the terms “first”, “second”, “third” and “fourth”, “primary”, “secondary”, “tertiary” etc. are used to distinguish one element from another. Note that the words “first”, “second”, “third” and “fourth”, “primary”, “secondary”, “tertiary” etc. are used here and elsewhere for labelling purposes only and are not intended to denote any specific spatial or temporal ordering.

Furthermore, the labelling of a first element does not imply the presence of a second element and vice versa.

It may be appreciated that FIGS. 1-4 comprise some modules or operations which are illustrated with a solid line and some modules or operations which are illustrated with a dashed line. The modules or operations which are comprised in a solid line are modules or operations which are comprised in the broadest example embodiment. The modules or operations which are comprised in a dashed line are example embodiments which may be comprised in, or a part of, or are further modules or operations which may be taken in addition to the modules or operations of the solid line example embodiments. It should be appreciated that these operations need not be performed in order presented. Furthermore, it should be appreciated that not all of the operations need to be performed. The exemplary operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the exemplary embodiments may be implemented at least in part by means of both hardware and software, and that several "means", "units" or "devices" may be represented by the same item of hardware.

The various exemplary methods, devices, and systems described herein are described in the general context of method steps processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform specified tasks or implement specific abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover all alternatives, modifications, and equivalents.

LIST OF REFERENCES

2 hearing device
4 housing
6 electronic circuit
8 electronic circuit board
10 first region/section
12 second region/section
14 first primary region/section
16 first secondary region/section
18 first tertiary region/section
20 primary region/section
22 secondary region/section
24 secondary first region/section
26 secondary second region/section
28 secondary third region/section
30 first bending region/section
31 first bend
32 second bending region/section
33 second bend
34 third bending region/section
35 third bend
36 fourth bending region/section
37 fourth bend
38 electrical connector pad
40 voltage converter
42 output transducer connector
44 command button/power switch
46 one or more processors
48 first input transducer, first microphone, rear microphone
50 second input transducer, second microphone, front microphone
52 charger coil connector pad
54 frequency regulator
56 temperature sensor
58 accelerometer
60 LED module
62 antenna(s)
64 fifth bending region
65 fifth bend
66 sixth bending region
67 sixth bend
L longitudinal axis
P first plane
S1 first surface
S2 second surface

The invention claimed is:

1. A hearing device configured for being worn at an ear of a user, the hearing device comprising: an electronic circuit board comprising a first section associated with a first voltage, and a second section associated with a second voltage; one or more first electronic components configured to operate at the first voltage, the one or more first electronic components being mounted at the first section, the first section having a first side and a second side opposite from the first side; and one or more second electronic components configured to operate at the second voltage, the one or more second electronic components being mounted at the second section; wherein the second voltage is lower than the first voltage; and wherein the first section associated with the first voltage, and the second section associated with the second voltage, lie in different respective planes that are non-coplanar with respect to each other;

wherein at least one of the one or more first electronic components comprise a voltage converter configured to provide voltage conversion; and wherein at least one of the one or more second electronic components comprise a processor, wherein the processor is between at least a part of the first section and at least a part of the second section, such that the at least the part of the first section of the electronic circuit board at least partly shields the processor from the voltage converter mounted at the first section.

2. An electronic circuit board for a hearing device, the electronic circuit board comprising: a first section comprising a plurality of first electrical connector pads for mounting one or more first electronic components, the first section being associated with a first voltage; and a second section comprising a plurality of second electrical connector pads for mounting one or more second electronic components, the second section being associated with a second voltage; wherein the plurality of first electrical connector pads is configured to be connected to the one or more first electrical components such that the one or more first electrical components are operable at the first voltage, wherein the plurality of second electrical connector pads are configured to be connected to the one or more second electrical components such that the one or more second electrical components are operable at the second voltage, wherein the second voltage is lower than the first voltage; wherein when the electronic circuit board is in an un-folded state, the one or more first electronic components are connected to the first section of the circuit board, and the one or more second electronic components are connected to the second section of the circuit board wherein the first section and second section are at different respective longitudinal locations along a longitudinal axis of the electronic circuit board, the longitudinal axis corresponding to a largest dimension of the electronic circuit board;

wherein the electronic circuit board is configured to be bent, and wherein when the electronic circuit board is in a bent state and when one of the one or more second electronic components is mounted at the second section of the electronic circuit board, the electronic circuit board comprises a first bend between the first section and the second section; and wherein the one or more second electronic components comprise a processor arranged between the first section and the second section, and wherein at least a part of the first section of the electronic circuit board is configured to at least partly shield the processor.

3. The hearing device according to claim 1, wherein the electronic circuit board comprises a first bend between the first section and the second section.

4. The hearing device according to claim 3, wherein the second section comprises a primary region and a secondary region, and wherein the electronic circuit board comprises a second bend between the primary region and the secondary region.

5. The hearing device according to claim 3, wherein the first bend has a bending angle that is anywhere from 130° to 210°.

6. The hearing device according to claim 4, wherein at least a part of the first section is sandwiched between the primary region and the secondary region.

7. The hearing device according to claim 4, wherein the second bend has a bending angle that is anywhere from 130° to 210°.

8. The hearing device according to claim 4, wherein the one or more second electronic components comprise an output transducer connector at the primary region, and an input transducer at the secondary region.

9. The hearing device according to claim 1, wherein the first section comprises an electrical connector pad for connecting a battery.

10. A hearing device configured for being worn at an ear of a user, the hearing device comprising: an electronic circuit board comprising a first section and a second section; one or more first electronic components configured to operate at a first voltage, the one or more first electronic components being mounted at the first section, wherein the one or more first electronic components comprise a voltage converter configured to provide a voltage conversion; and one or more second electronic components configured to operate at a second voltage, the one or more second electronic components being at the second section, wherein the one or more second electronic components comprise a processor arranged between the first section and the second section of the electronic circuit board, and wherein the first section of the electronic circuit board is configured to at least partly shield the processor; wherein the second voltage is lower than the first voltage; and wherein the hearing device further comprises a battery configured to provide a battery voltage, wherein the battery voltage is closer to the first voltage than to the second voltage.

11. The hearing device according to claim 10, wherein the battery is electrically connected to the electronic circuit board via an electrical connector pad, wherein the battery is upstream from the first section, and wherein the second section is downstream from the first section.

12. The hearing device according to claim 1, wherein the voltage converter is configured to step-down convert from a battery voltage and/or the first voltage to the second voltage.

13. The hearing device according to claim 1, wherein at least one of the one or more first electronic components has a corrosion protection coating.

14. The hearing device according to claim 1, wherein a power wiring of the electronic circuit board is in one single layer.

15. The hearing device according to claim 1, wherein the electronic circuit board is a 4-layer or 5-layer circuit board.

16. The hearing device according to claim 1, wherein the first voltage is in anywhere from 3,5 V to 4,5 V.

17. The hearing device according to claim 1, wherein the second voltage is anywhere from 0.5 V to 2,0 V.

18. An electronic circuit for a hearing device, the electronic circuit comprising: an electronic circuit board comprising a first section associated with a first voltage, and a second section associated with a second voltage; one or more first electronic components configured to operate at the first voltage, the one or more first electronic components being mounted at the first section, the first section having a first side and a second side opposite from the first side, wherein the one or more first electronic components comprise a voltage converter configured to provide voltage conversion; and one or more second electronic components configured to operate at the second voltage, the one or more second electronic components being mounted at the second section; wherein the second voltage is lower than the first voltage; wherein the first section associated with the first voltage, and the second section associated with the second voltage, lie in different respective planes that are non-coplanar with respect to each other; and wherein the voltage converter is mounted at the first side of the first section, wherein at least one of the one or more second electronic components comprise a processor arranged between the first section and the second section of the electronic circuit board, and wherein at least a part of the first section is configured to at least partly shield the processor.

19. An electronic circuit board for a hearing device, the electronic circuit board comprising: a first section comprising a plurality of first electrical connector pads for mounting one or more first electronic components, the first section being associated with a first voltage, the first section having a first side and a second side opposite from the first side, wherein the one or more first electronic components comprise a voltage converter configured to provide voltage conversion; and a second section comprising a plurality of second electrical connector pads for mounting one or more second electronic components, the second section being associated with a second voltage, wherein the one or more second electronic components comprise a processor, and wherein the first section of the electronic circuit board is configured to at least partly shield the processor from the voltage converter when the voltage converter is mounted at the first section and when the processor is mounted at the second section; wherein the plurality of first electrical connector pads is configured to be connected to the one or more first electrical components such that the one or more first electrical components are operable at the first voltage, wherein the plurality of second electrical connector pads are configured to be connected to the one or more second electrical components such that the one or more second electrical components are operable at the second voltage, wherein the second voltage is lower than the first voltage; wherein the electronic circuit board has an unfolded state and is configured to be folded, and wherein the first section associated with the first voltage, and the second section associated with the second voltage, lie in different respective planes that are non-coplanar with respect to each other when the electronic circuit board is folded; and wherein the first side of the first section is configured to connect with the voltage converter.

20. A method of manufacturing an electronic circuit for a hearing device, the method comprising: providing an electronic circuit board; mounting one or more first electronic components at a first section of the electronic circuit board, the first section being associated with a first voltage, the first section having a first side and a second side opposite from the second side, wherein the one or more first electronic components comprise a voltage converter configured to provide voltage conversion; and mounting one or more second electronic components at a second section of the electronic circuit board, the second section being associated with a second voltage, wherein the one or more second electronic components comprise a processor, and wherein after the act of mounting the one or more second electronic components is performed, the processor is arranged between the first section and the second section of the electronic circuit board; wherein the one or more first electronic components are configured to operate at the first voltage, wherein the one or more second electronic components are configured to operate at the second voltage, wherein the second voltage is lower than the first voltage; wherein the first section associated with the first voltage, and the second section associated with the second voltage, lie in different respective planes that are non-coplanar with respect to each other; and wherein the voltage converter is mounted at the first side of the first section.

21. A circuit comprising the electronic circuit board of claim 2, the one or more first electronic components, and the one or more second electronic components.

22. The circuit according to claim 21, wherein the one or more first electronic components comprise multiple first electronic components configured to operate at the first voltage.

23. A hearing device comprising the circuit of claim 22.

24. The electronic circuit board according to claim 2, wherein the second section comprises a primary region and a secondary region, and wherein when the electronic circuit board is in the bent state, the electronic circuit board comprises a second bend between the primary region and the secondary region.

25. The electronic circuit board according to claim 24, wherein when the electronic circuit board is in the bent state, at least a part of the first section is sandwiched between the primary region and the secondary region.

26. The hearing device according to claim 23, wherein the one or more second electronic components comprise an output transducer connector at the primary region, and an input transducer at the secondary region.

27. The hearing device according to claim 23, comprising a battery configured to provide a battery voltage, wherein the battery voltage is closer to the first voltage than to the second voltage.

28. The electronic circuit board according to claim 2, wherein the largest dimension of the electronic circuit board extends along the longitudinal axis.

* * * * *